United States Patent
Jereczek et al.

(10) Patent No.: US 10,552,319 B2
(45) Date of Patent: Feb. 4, 2020

(54) INTERLEAVE SET AWARE OBJECT ALLOCATION

(71) Applicant: Intel Corporation, Santa Clara, CA (US)

(72) Inventors: Grzegorz Jereczek, Gdansk (PL); Pawel Lebioda, Robakowo (PL); Maciej Maciejewski, Gdansk (PL); Pawel Makowski, Gdansk (PL); Piotr Pelplinski, Sopot (PL); Jakub Radtke, Gdansk (PL); Aleksandra Wisz, Gdansk (PL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/995,213

(22) Filed: Jun. 1, 2018

(65) Prior Publication Data

US 2019/0042409 A1   Feb. 7, 2019

(51) Int. Cl.

| | | |
|---|---|---|
| *G06F 12/00* | (2006.01) | |
| *G06F 12/06* | (2006.01) | |
| *G06F 9/30* | (2018.01) | |
| *G06F 12/0862* | (2016.01) | |
| G06F 13/00 | (2006.01) | |
| G06F 13/28 | (2006.01) | |
| G11C 7/10 | (2006.01) | |

(52) U.S. Cl.
CPC ...... *G06F 12/0607* (2013.01); *G06F 9/30036* (2013.01); *G06F 12/0862* (2013.01); *G11C 7/1042* (2013.01)

(58) Field of Classification Search
CPC ............ G06F 12/0607; G06F 12/0862; G06F 9/30036; G11C 7/1042
See application file for complete search history.

(56) References Cited

U.S. PATENT DOCUMENTS

| | | | | |
|---|---|---|---|---|
| 5,848,258 A * | 12/1998 | Fenwick | ............. | G06F 12/0607 711/5 |
| 7,007,114 B1 * | 2/2006 | White | .................... | G06F 13/28 326/56 |
| 7,802,064 B2 * | 9/2010 | Kim | .................... | G06F 12/0246 711/103 |
| 2002/0097608 A1 * | 7/2002 | Skotnicki | ........... | H01L 29/0653 365/185.27 |
| 2007/0005934 A1 * | 1/2007 | Rotithor | ............. | G06F 12/0862 711/213 |
| 2013/0328889 A1 * | 12/2013 | Chen | ......................... | G06T 1/60 345/501 |
| 2014/0258349 A1 * | 9/2014 | Meltzer | ................. | G06F 16/183 707/827 |

OTHER PUBLICATIONS

"DPDK", dpdk.org/, Retrieved on Apr. 19, 2018, 2 pages.
(Continued)

*Primary Examiner* — Mark A Giardino, Jr.
(74) *Attorney, Agent, or Firm* — Jordan IP Law, LLC (57) ABSTRACT

An embodiment of a semiconductor apparatus may include technology to identify a group of objects based on a common object structure, and allocate the group of objects to two or more memory channels based on interleave set information. Other embodiments are disclosed and claimed.

25 Claims, 4 Drawing Sheets

(56) References Cited

OTHER PUBLICATIONS

"Persistent memory development kit: The libpmemobj library", pmem.io/pmdk/libpmemobj/, Retrieved on Apr. 19, 2018, 1 page.
"Persistent memory development kit: libpmemobj", pmem.io/pmdk/, Retrieved on Apr. 19, 2018, 3 pages.
"PMDK main source repo", github.com/pmem/pmdk, Retrieved on Apr. 19, 2018, 7 pages.
"Persistent memory programming", pmem.io/, Retrieved on Apr. 19, 2018, 2 pages.
"PMEMOBJ", github.com/pmem/pmdk/blob/master/doc/libpmemobj/pmemobj_alloc.3.md, Retrieved on Apr. 19, 2018, 4 pages.
"Index: DPDK", dpdk.org/browse/dpdk/tree/, Retrieved on Apr. 19, 2018, 1 page.

\* cited by examiner

| Interleave block | 00 | 01 | 02 | 03 | 04 | 05 | 06 | 07 | 08 | 09 | 10 | 11 | 12 | 13 | 14 | 15 |
|---|---|---|---|---|---|---|---|---|---|---|---|---|---|---|---|---|
| Memory Channel | 0 | 1 | 2 | 3 | 4 | 5 | 0 | 1 | 2 | 3 | 4 | 5 | 0 | 1 | 2 | 3 |
| NVDIMM | 0 | 1 | 2 | 3 | 4 | 5 | 0 | 1 | 2 | 3 | 4 | 5 | 0 | 1 | 2 | 3 |
| KV Object | 0 | 0 | 0 | 0 | 1 | 1 | 1 | 1 | 2 | 2 | 2 | 2 | 3 | 3 | 3 | 3 |

FIG. 4A

| Interleave block | 00 | 01 | 02 | 03 | 04 | 05 | 06 | 07 | 08 | 09 | 10 | 11 | 12 | 13 | 14 | 15 | 16 | 17 | 18 | 19 |
|---|---|---|---|---|---|---|---|---|---|---|---|---|---|---|---|---|---|---|---|---|
| Memory Channel | 0 | 1 | 2 | 3 | 4 | 5 | 0 | 1 | 2 | 3 | 4 | 5 | 0 | 1 | 2 | 3 | 4 | 5 | 0 | 1 |
| NVDIMM | 0 | 1 | 2 | 3 | 4 | 5 | 0 | 1 | 2 | 3 | 4 | 5 | 0 | 1 | 2 | 3 | 4 | 5 | 0 | 1 |
| KV Object | 0 | 0 | 0 | 0 | 0* | 1 | 1 | 1 | 1 | 1* | 2 | 2 | 2 | 2 | 2* | 3 | 3 | 3 | 3 | 3* |

\* Padding

INTERLEAVE SET AWARE OBJECT ALLOCATION

TECHNICAL FIELD

Embodiments generally relate to memory systems. More particularly, embodiments relate to interleave set aware object allocation.

BACKGROUND

A memory system may include multiple memory banks, each of which may include multiple memory devices. Such memory devices may include dual-inline memory modules (DIMMs), including non-volatile DIMMs (NVDIMMs). Some memory systems may include interleaved memory where memory addresses may be spread across the multiple memory banks.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Various embodiments described herein may include a memory component and/or an interface to a memory component. Such memory components may include volatile and/or nonvolatile memory. Nonvolatile memory may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory may be a storage medium that requires power to maintain the state of data stored by the medium. Non-limiting examples of volatile memory may include various types of RAM, such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Figure 1:
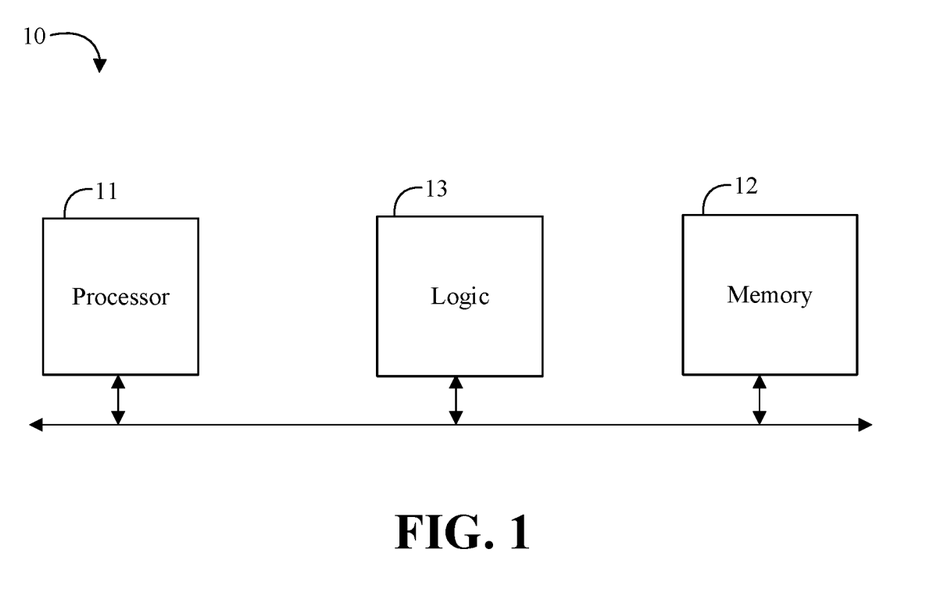
FIG. 1 is a block diagram of an example of an electronic processing system according to an embodiment.

Turning now to FIG. 1, an embodiment of an electronic processing system 10 may include a processor 11, memory 12 communicatively coupled to the processor 11, and logic 13 communicatively coupled to the processor 11 to identify a group of objects based on a common object structure, and allocate the group of objects to two or more memory channels based on interleave set information. In some embodiments, the logic 13 may be configured to identify an alignment field of the common object structure, and allocate the group of objects to start the alignment field for each object on a different one of the two or more memory channels. For example, the logic 13 may be further configured to add padding to each object to align the alignment field to start on the different one of the two or more memory channels. In some embodiments, the logic 13 may be further configured to access the group of objects with two or more of the memory channels. For example, the logic 13 may be configured to access the group of objects with one or more of multi-threaded access, prefetch access, and vector instruction access. In any of the embodiments herein, the two or more memory channels may include non-volatile memory (NVM) channels (e.g., non-volatile dual inline memory module (NVDIMM) channels), and/or the group of objects may include one or more of key-value objects and database objects. In some embodiments, the logic 13 may be located in, or co-located with, various components, including the processor 11 (e.g., on a same die).

Embodiments of each of the above processor 11, memory 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the processor 11 may include a general purpose processor, a special purpose processor, a central processor unit (CPU), a controller, a micro-controller, etc.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the memory 12, persistent storage media, or other system memory may store a set of instructions which when executed by the processor 11 cause the system 10 to implement one or more components, features, or aspects of the system 10 (e.g., the logic 13, identifying the group of objects based on the common object structure, allocating the group of objects to the memory channels based on interleave set information, etc.).

Figure 2:
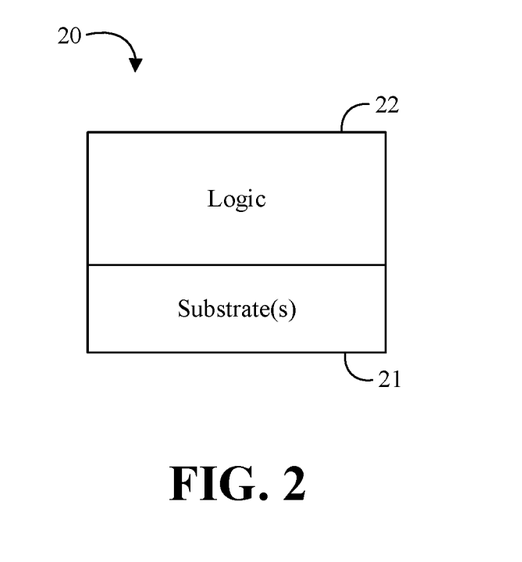
FIG. 2 is a block diagram of an example of a semiconductor apparatus according to an embodiment.

Turning now to FIG. 2, an embodiment of a semiconductor apparatus 20 may include one or more substrates 21, and logic 22 coupled to the one or more substrates 21, wherein the logic 22 is at least partly implemented in one or more of configurable logic and fixed-functionality hardware logic. The logic 22 coupled to the one or more substrates 21 may be configured to identify a group of objects based on a common object structure, and allocate the group of objects to two or more memory channels based on interleave set information. In some embodiments, the logic 22 may be configured to identify an alignment field of the common object structure, and allocate the group of objects to start the alignment field for each object on a different one of the two or more memory channels. For example, the logic 22 may be further configured to add padding to each object to align the alignment field to start on the different one of the two or more memory channels. In some embodiments, the logic 22 may be further configured to access the group of objects with two or more of the memory channels. For example, the logic 22 may be configured to access the group of objects with one or more of multi-threaded access, prefetch access, and vector instruction access. In any of the embodiments herein, the two or more memory channels may include NVM channels (e.g., NVDIMM channels), and/or the group of objects may include one or more of key-value objects and database objects. In some embodiments, the logic 22 coupled to the one or more substrates 21 may include transistor channel regions that are positioned within the one or more substrates 21.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

The apparatus 20 may implement one or more aspects of the method 30 (FIGS. 3A to 3C), or any of the embodiments discussed herein. In some embodiments, the illustrated apparatus 20 may include the one or more substrates 21 (e.g., silicon, sapphire, gallium arsenide) and the logic 22 (e.g., transistor array and other integrated circuit/IC components) coupled to the substrate(s) 21. The logic 22 may be implemented at least partly in configurable logic or fixed-functionality logic hardware. In one example, the logic 22 may include transistor channel regions that are positioned (e.g., embedded) within the substrate(s) 21. Thus, the interface between the logic 22 and the substrate(s) 21 may not be an abrupt junction. The logic 22 may also be considered to include an epitaxial layer that is grown on an initial wafer of the substrate(s) 21.

Figure 3A:
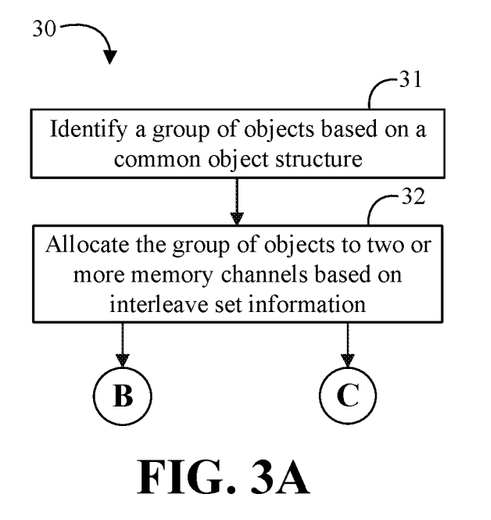
FIGS. 3A to 3C are flowcharts of an example of a method of managing memory according to an embodiment.
Figure 3B:
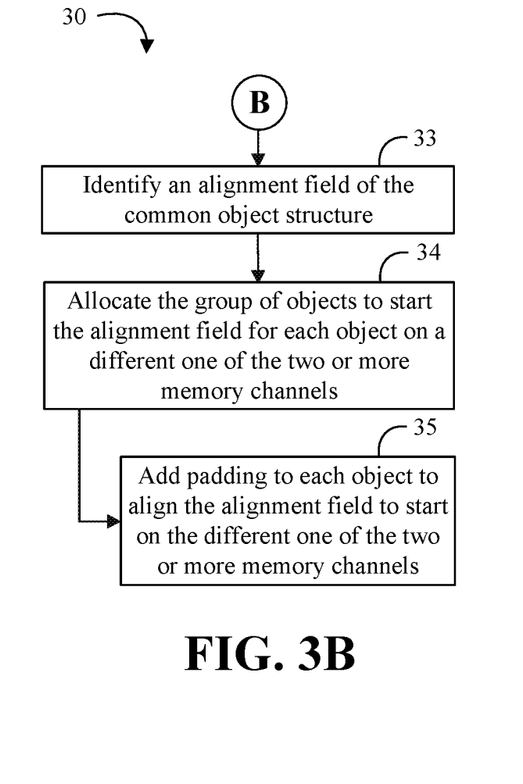
Figure 3C:
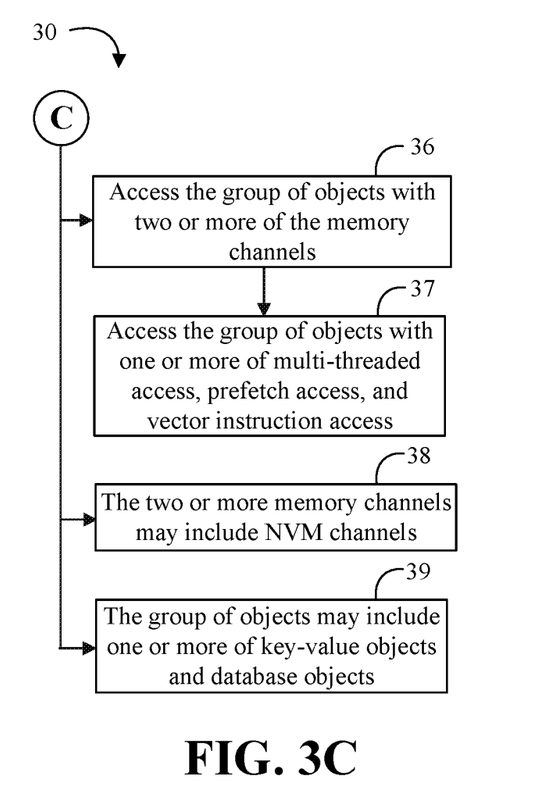

Turning now to FIGS. 3A to 3C, an embodiment of a method 30 of managing memory may include identifying a group of objects based on a common object structure at block 31, and allocating the group of objects to two or more memory channels based on interleave set information at block 32. Some embodiments of the method 30 may include identifying an alignment field of the common object structure at block 33, and allocating the group of objects to start the alignment field for each object on a different one of the two or more memory channels at block 34. For example, the method 30 may include adding padding to each object to align the alignment field to start on the different one of the two or more memory channels at block 35. Some embodiments of the method 30 may further include accessing the group of objects with two or more of the memory channels at block 36 (e.g., multiple memory channels). For example, the method 30 may include accessing the group of objects with one or more of multi-threaded access, prefetch access, and vector instruction access at block 37. In any of the embodiments herein, the two or more memory channels may include NVM channels at block 38 (e.g., NVDIMM channels), and/or the group of objects may include one or more of key-value objects and database objects at block 39.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 30 may be implemented on a computer readable medium as described in connection with Examples 20 to 25 below. Embodiments or portions of the method 30 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide NVDIMM interleave-set-aware object allocations for Key-Value Stores (KVS). User-space software libraries for NVDIMMs, such as Persistent Memory Development Kit (PMDK), allow applications direct load/store access to persistent memory. This, in turn, allows the creation of scalable, persistent, in-memory services, like in-memory KVS. An in-memory KVS may offer the advantages of both disk-based stores (e.g., capacity and persistence) and DRAM-based volatile stores (e.g., performance). Careful memory management may be required to achieve the best performance for the KVS. Particularly, if independent objects are not appropriately or optimally spread across channels of the available NVDIMM modules, performance may not be optimal. For example, some channels of the NVDIMM may be more loaded than the others and may become a bottleneck of an application. Some embodiments may advantageously spread independent objects across channels of the available NVDIMMs to more evenly load the NVDIMMs and/or to improve or optimize performance.

The PDMK libpmemobj library (e.g., see http://pmem.io/pmdk/libpmemobj), for example, may provide a transactional object store with memory management. The libpmemobj library does not, however, optimize memory alignment of the objects. The Data Plane Development Kit (DPDK) mempool library (e.g., see https://dpdk.org) may include an allocator of fixed-size objects and may provide a memory alignment helper to ensure that network packet objects are padded to spread their headers equally on all memory channels and ranks. The focus of the mempool library is on packet processing and volatile DIMMs (e.g., NVDIMM-based generic object stores are not considered). Furthermore, DPDK assumes by default that the interleave set block size is equal to the CPU cache line size (64 bytes), but for some NVDIMMs, the interleaving may be done differently from the CPU cache line size (e.g., per every four cache lines or 256 bytes).

Some embodiments may advantageously leverage common object structure in a pool of objects to allocate the objects better or optimally on NVDIMMs using the available interleave sets. In some embodiments, some frequently accessed field of the object (e.g., an alignment field) may be selected to be aligned so that for each object, the selected field starts on a different memory channel. Advantageously, such field alignment may cause all of the memory channels to be equally loaded or more evenly loaded.

For example, some embodiments may be applied to the PMDK library. Applications that are built on top of the improved PMDK library and utilize object pools with common access patterns may benefit, performance-wise, from the increased efficiency in access to the NVDIMM modules provided by some embodiments. In some applications, the full bandwidth offered by all NVDIMMs may be reached and latency may be reduced by some embodiments (e.g., when scanning keys of a KVS).

Figure 4A:
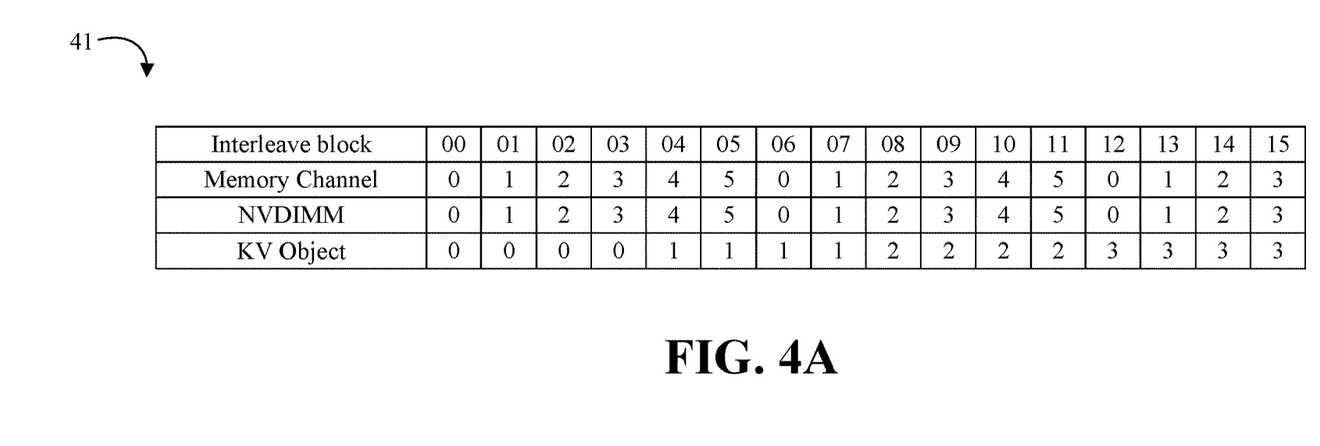
FIGS. 4A to 4B are illustrative diagrams of examples of respective interleave set allocations according to an embodiment.

Turning now to FIGS. 4A to 4B, an example first illustrative interleave set allocation 41 may show how four key-value pairs are stored in memory (FIG. 4A). For example, the memory system may include six memory channels populated with one NVDIMM each, and an example interleave set block size of four cache lines (e.g., 256 B). For an example KVS, a total size of key, value, and metadata may be assumed to be four block sizes (e.g., 1024 B) for illustration purposes. For interleave blocks 00 through 15 (e.g., a memory range corresponding to a particular interleave block number with a block size of 256 B), memory blocks for KV objects 0 through 3 may be allocated to memory channels 0 through 5 (e.g., over which a particular memory block is accessed, belonging in this example to NVDIMMs 0 through 5). Memory blocks for KV object 0 may start at interleave block 00 (e.g., corresponding to memory channel/NVDIMM 0), memory blocks for KV object 1 may start at interleave block 04 (e.g., corresponding to memory channel/NVDIMM 4), memory blocks for KV object 2 may start at interleave block 08 (e.g., corresponding to memory channel/NVDIMM 2), and memory blocks for KV object 3 may start at interleave block 12 (e.g., corresponding to memory channel/NVDIMM 0). For a simple scanning operation of keys (e.g., for each pair the key stored in the first of four interleave blocks) by multiple threads, multiple applications with shared memory or single thread with prefetching, the first illustrative interleave set allocation 41 shows that only three memory channels (0, 4, and 2) will be utilized, so half of the available memory bandwidth may be unutilized.

Figure 4B:
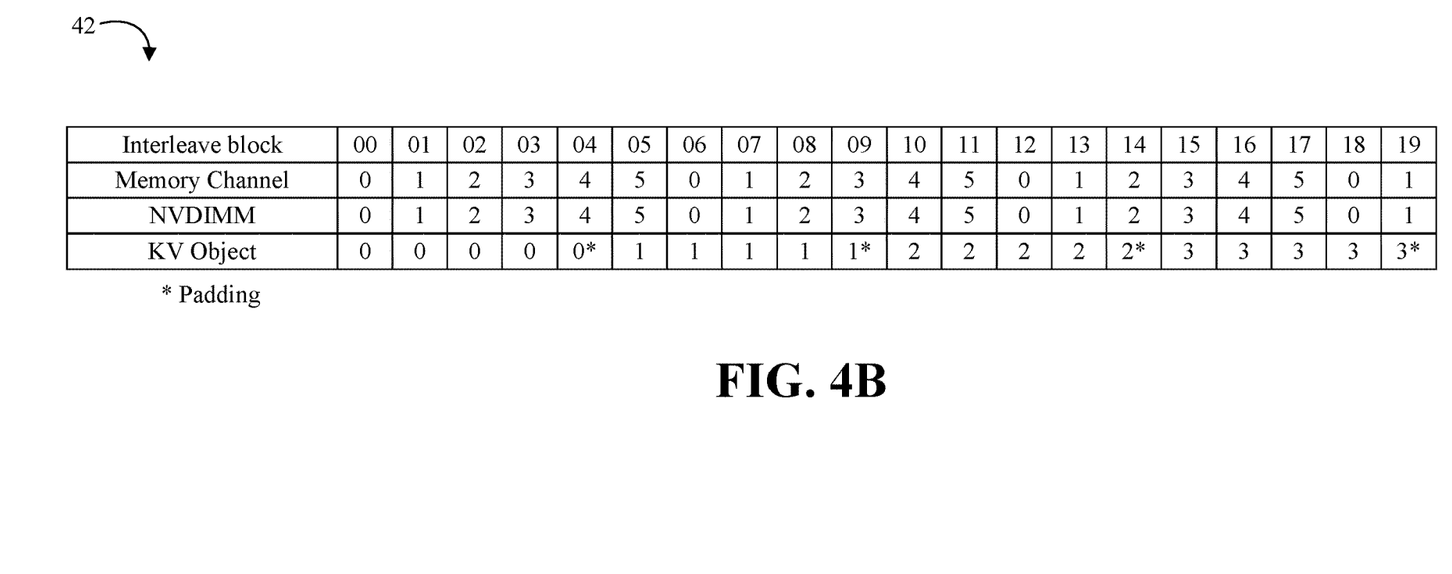

An example second illustrative interleave set allocation 42 (FIG. 4B) may show how four key-value pairs are stored in memory based on the interleave set block size in accordance with some embodiments. Some embodiments may advantageously add padding to every object to allocate the KV objects to the memory channels. For interleave blocks 00 through 19, memory blocks for KV objects 0 through 3 may be allocated to memory channels 0 through 5 (e.g., corresponding in this example to NVDIMMs 0 through 5). Memory blocks for KV object 0 may start at interleave block 00 (e.g., corresponding to memory channel/NVDIMM 0), padding may be added to KV object 0 at interleave block 04 such that memory blocks for KV object 1 start at interleave block 05 (e.g., corresponding to memory channel/NVDIMM 5), padding may be added to KV object 1 at interleave block 09 such that memory blocks for KV object 2 start at interleave block 10 (e.g., corresponding to memory channel/NVDIMM 4), and padding may be added to KV object 2 at interleave block 14 such that memory blocks for KV object 3 start at interleave block 15 (e.g., corresponding to memory channel/NVDIMM 3). Padding may also be added to KV object 3 at interleave block 19. In this example, 256 B of padding may be added for every key-value pair (e.g., a total of 1024 plus 256=1280 B). Advantageously, the memory channels 0 through 6 may be more fully utilized (e.g., 4 of the 6 channels in the second allocation 42 as compared to 3 of the 6 channels in the first allocation 41), and the load may be more evenly spread (e.g., one KV object per memory channel in the second allocation 42 as compared to two KV objects assigned to the same memory channel 0 in the first allocation 41). Depending on the data set, all six memory channels may be utilized and more evenly loaded to provide improved or maximum available memory bandwidth.

Figure 5:
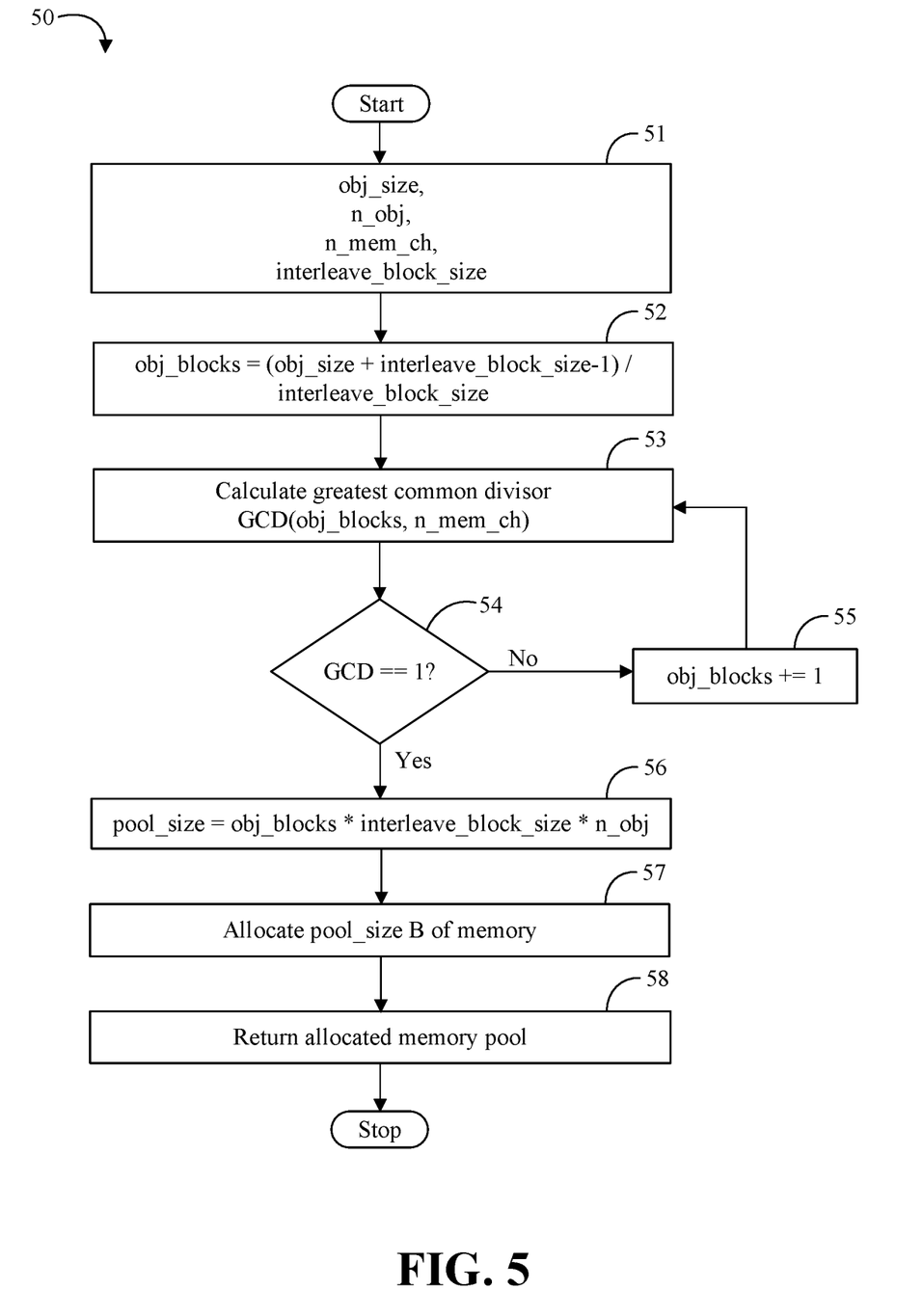
FIG. 5 is a flowchart of an example of a method of creating a common pool of objects according to an embodiment.

Turning now to FIG. 5, a method 50 of creating a common pool of objects may include initializing variables for an object size (obj_size), number of objects (n_obj), number of memory channels (n_mem_ch), and interleave block size (interleave_block_size) at block 51. A variable for object blocks (obj_blocks) may then be determined as obj_blocks= (obj_size+interleave_block_size−1)/interleave_block_size at block 52. The method 50 may then calculate a greatest common divisor (GCD) of the object blocks and number of memory channels at block 53 (e.g., GCD(obj_blocks, n_mem_ch)). If the GCD is not equal to 1 at block 54, the value of obj_blocks may be incremented by 1 at block 55, and the method may return to block 53. When the GCD is equal to 1 at block 54, the method 50 may set the pool size (pool_size) as pool_size=obj_blocks*interleave_block_size*n_obj at block 56, allocate pool_size bytes of memory at block 57, and return the allocated memory pool at block 58.

Some embodiments may include object allocation technology and object access technology. The object allocation technology may include technology to create a common pool of objects (e.g., the method 50) and technology to perform object allocation on user request. For example, whenever object allocation is requested, the requested number of objects, if available, may be marked as in use in the pool as allocated from the method 50. The pointers to those objects may then be returned to the requestor. On release, the released objects may then be marked as free and returned to the pool.

Appropriately configured object access technology may exploit the object allocation technology for improved performance when accessing multiple objects. Suitable object access technology may include multi-threaded access, prefetch access, and/or vector instruction access. In multi-threaded access, for example, multiple applications or application threads may access the store simultaneously for scanning operation or other operations involving access to multiple objects. In prefetching, for example, a single-threaded application may prefetch objects when performing scanning operation or other operations involving access to multiple objects. In vector instructions, for example, operations may be performed on an entire vector of objects. Advantageously, some embodiments of object allocation technology may spread objects across NVDIMM memory channels. The object access mechanism may then utilize multiple memory channels (e.g., scan/update operations in particular).

A KVS or other database system implementing one or more of the aspects of the embodiments described herein may advantageously improve performance and/or save power by avoiding some memory bottlenecks. Without being limited to theory of operation, a maximum performance gain may be equal to the number of memory channels and may depend on the object size. A maximum memory usage overhead due to padding may also depend on the object size and may be between a few bytes to a few interleave blocks.

ADDITIONAL NOTES AND EXAMPLES

Example 1 may include an electronic processing system, comprising a processor, memory communicatively coupled to the processor, and logic communicatively coupled to the processor to identify a group of objects based on a common object structure, and allocate the group of objects to two or more memory channels based on interleave set information.

Example 2 may include the system of Example 1, wherein the logic is further to identify an alignment field of the common object structure, and allocate the group of objects to start the alignment field for each object on a different one of the two or more memory channels.

Example 3 may include the system of Example 2, wherein the logic is further to add padding to each object to align the alignment field to start on the different one of the two or more memory channels.

Example 4 may include the system of Example 1, wherein the logic is further to access the group of objects with two or more of the memory channels.

Example 5 may include the system of Example 4, wherein the logic is further to access the group of objects with one or more of multi-threaded access, prefetch access, and vector instruction access.

Example 6 may include the system of any of Examples 1 to 5, wherein the two or more memory channels include non-volatile memory channels, and wherein the group of objects include one or more of key-value objects and database objects.

Example 7 may include a semiconductor apparatus, comprising one or more substrates, and logic coupled to the one or more substrates, wherein the logic is at least partly implemented in one or more of configurable logic and fixed-functionality hardware logic, the logic coupled to the one or more substrates to identify a group of objects based on a common object structure, and allocate the group of objects to two or more memory channels based on interleave set information.

Example 8 may include the apparatus of Example 7, wherein the logic is further to identify an alignment field of the common object structure, and allocate the group of objects to start the alignment field for each object on a different one of the two or more memory channels.

Example 9 may include the apparatus of Example 8, wherein the logic is further to add padding to each object to align the alignment field to start on the different one of the two or more memory channels.

Example 10 may include the apparatus of Example 7, wherein the logic is further to access the group of objects with two or more of the memory channels.

Example 11 may include the apparatus of Example 10, wherein the logic is further to access the group of objects with one or more of multi-threaded access, prefetch access, and vector instruction access.

Example 12 may include the apparatus of any of Examples 7 to 11, wherein the two or more memory channels include non-volatile memory channels, and wherein the group of objects include one or more of key-value objects and database objects.

Example 13 may include the apparatus of any of Examples 7 to 12, wherein the logic coupled to the one or more substrates includes transistor channel regions that are positioned within the one or more substrates.

Example 14 may include a method of managing memory, comprising identifying a group of objects based on a common object structure, and allocating the group of objects to two or more memory channels based on interleave set information.

Example 15 may include the method of Example 14, further comprising identifying an alignment field of the common object structure, and allocating the group of objects to start the alignment field for each object on a different one of the two or more memory channels.

Example 16 may include the method of Example 15, further comprising adding padding to each object to align the alignment field to start on the different one of the two or more memory channels.

Example 17 may include the method of Example 14, further comprising accessing the group of objects with two or more of the memory channels.

Example 18 may include the method of Example 17, further comprising accessing the group of objects with one or more of multi-threaded access, prefetch access, and vector instruction access.

Example 19 may include the method of any of Examples 14 to 18, wherein the two or more memory channels include non-volatile memory channels, and wherein the group of objects include one or more of key-value objects and database objects.

Example 20 may include at least one computer readable storage medium, comprising a set of instructions, which when executed by a computing device, cause the computing device to identify a group of objects based on a common object structure, and allocate the group of objects to two or more memory channels based on interleave set information.

Example 21 may include the at least one computer readable storage medium of Example 20, comprising a further set of instructions, which when executed by the computing device, cause the computing device to identify an alignment field of the common object structure, and allocate the group of objects to start the alignment field for each object on a different one of the two or more memory channels.

Example 22 may include the at least one computer readable storage medium of Example 21, comprising a further set of instructions, which when executed by the computing device, cause the computing device to add padding to each object to align the alignment field to start on the different one of the two or more memory channels.

Example 23 may include the at least one computer readable storage medium of Example 20, comprising a further set of instructions, which when executed by the computing device, cause the computing device to access the group of objects with two or more of the memory channels.

Example 24 may include the at least one computer readable storage medium of Example 23, comprising a further set of instructions, which when executed by the computing device, cause the computing device to access the group of objects with one or more of multi-threaded access, prefetch access, and vector instruction access.

Example 25 may include the at least one computer readable storage medium of any of Examples 20 to 24, wherein the two or more memory channels include non-volatile memory channels, and wherein the group of objects include one or more of key-value objects and database objects.

Example 26 may include a memory manager apparatus, comprising means for identifying a group of objects based on a common object structure, and means for allocating the group of objects to two or more memory channels based on interleave set information.

Example 27 may include the apparatus of Example 26, further comprising means for identifying an alignment field of the common object structure, and means for allocating the group of objects to start the alignment field for each object on a different one of the two or more memory channels.

Example 28 may include the apparatus of Example 27, further comprising means for adding padding to each object to align the alignment field to start on the different one of the two or more memory channels.

Example 29 may include the apparatus of Example 26, further comprising means for accessing the group of objects with two or more of the memory channels.

Example 30 may include the apparatus of Example 29, further comprising means for accessing the group of objects with one or more of multi-threaded access, prefetch access, and vector instruction access.

Example 31 may include the apparatus of any of Examples 26 to 30, wherein the two or more memory channels include non-volatile memory channels, and wherein the group of objects include one or more of key-value objects and database objects.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic processing system, comprising:
   a processor;
   memory communicatively coupled to the processor; and
   logic communicatively coupled to the processor to:
   identify a group of objects based on a common object structure,
   identify a frequently accessed field of the common object structure as an alignment field for each object, and
   allocate the group of objects to two or more memory channels based on interleave set information so as to associate the alignment field for each object with a different one of the two or more memory channels to spread the alignment field for each object evenly among the two or more memory channels.

2. The system of claim 1, wherein the frequently accessed field is an object header.

3. The system of claim 2, wherein the logic is further to:
   add padding to each object to align the alignment field to associate each object header with the different one of the two or more memory channels to spread each object header evenly among the two or more memory channels.

4. The system of claim 1, wherein the logic is further to:
   access the group of objects with two or more of the memory channels.

5. The system of claim 4, wherein the logic is further to:
   access the group of objects with one or more of multi-threaded access, prefetch access, and vector instruction access.

6. The system of claim 1, wherein the two or more memory channels include non-volatile memory channels, and wherein the group of objects include one or more of key-value objects and database objects.

7. A semiconductor apparatus, comprising:
   one or more substrates; and
   logic coupled to the one or more substrates, wherein the logic is at least partly implemented in one or more of configurable logic and fixed-functionality hardware logic, the logic coupled to the one or more substrates to:
   identify a group of objects based on a common object structure,
   identify a frequently accessed field of the common object structure as an alignment field for each object, and
   allocate the group of objects to two or more memory channels based on interleave set information so as to associate the alignment field for each object with a different one of the two or more memory channels to spread the alignment field for each object evenly among the two or more memory channels.

8. The apparatus of claim 7, wherein the frequently accessed field is an object header.

9. The apparatus of claim 8, wherein the logic is further to:
   add padding to each object to align the alignment field to associate each object header with the different one of the two or more memory channels to spread each object header evenly among the two or more memory channels.

10. The apparatus of claim 7, wherein the logic is further to:
    access the group of objects with two or more of the memory channels.

11. The apparatus of claim 10, wherein the logic is further to:
    access the group of objects with one or more of multi-threaded access, prefetch access, and vector instruction access.

12. The apparatus of claim 7, wherein the two or more memory channels include non-volatile memory channels, and wherein the group of objects include one or more of key-value objects and database objects.

13. The apparatus of claim 7, wherein the logic coupled to the one or more substrates includes transistor channel regions that are positioned within the one or more substrates.

14. A method of managing memory, comprising:
    identifying a group of objects based on a common object structure;
    identifying a frequently accessed field of the common object structure as an alignment field for each object, and
    allocating the group of objects to two or more memory channels based on interleave set information so as to associate the alignment field for each object with a different one of the two or more memory channels to spread the alignment field for each object evenly among the two or more memory channels.

15. The method of claim 14, wherein the frequently accessed field is an object header.

16. The method of claim 15, further comprising:
    adding padding to each object to align the alignment field to associate each object header with the different one of the two or more memory channels to spread each object header evenly among the two or more memory channels.

17. The method of claim 14, further comprising:
    accessing the group of objects with two or more of the memory channels.

18. The method of claim 17, further comprising:
    accessing the group of objects with one or more of multi-threaded access, prefetch access, and vector instruction access.

19. The method of claim 14, wherein the two or more memory channels include non-volatile memory channels, and wherein the group of objects include one or more of key-value objects and database objects.

20. At least one computer readable storage medium, comprising a set of instructions, which when executed by a computing device, cause the computing device to:
    identify a group of objects based on a common object structure;
    identify a frequently accessed field of the common object structure as an alignment field for each object, and
    allocate the group of objects to two or more memory channels based on interleave set information so as to associate the alignment field for each object with a different one of the two or more memory channels to spread the alignment field for each object evenly among the two or more memory channels.

21. The at least one computer readable storage medium of claim 20, wherein the frequently accessed field is an object header.

22. The at least one computer readable storage medium of claim 21, comprising a further set of instructions, which when executed by the computing device, cause the computing device to:

add padding to each object to align the alignment field to associate each object header with the different one of the two or more memory channels to spread each object header evenly among the two or more memory channels.

23. The at least one computer readable storage medium of claim 20, comprising a further set of instructions, which when executed by the computing device, cause the computing device to:

access the group of objects with two or more of the memory channels.

24. The at least one computer readable storage medium of claim 23, comprising a further set of instructions, which when executed by the computing device, cause the computing device to:

access the group of objects with one or more of multi-threaded access, prefetch access, and vector instruction access.

25. The at least one computer readable storage medium of claim 20, wherein the two or more memory channels include non-volatile memory channels, and wherein the group of objects include one or more of key-value objects and database objects.

* * * * *